US006943066B2

(12) United States Patent
Brody et al.

(10) Patent No.: US 6,943,066 B2
(45) Date of Patent: Sep. 13, 2005

(54) ACTIVE MATRIX BACKPLANE FOR CONTROLLING CONTROLLED ELEMENTS AND METHOD OF MANUFACTURE THEREOF

(75) Inventors: Thomas P. Brody, Pittsburgh, PA (US); Paul R. Malmberg, Pittsburgh, PA (US); Robert E. Stapleton, deceased, late of Monroeville, PA (US); by David J. Stapleton, legal representative, Monroeville, PA (US)

(73) Assignee: Advantech Global, LTD, Tortola (VG)

(*) Notice: Subject to any disclaimer, the term of this patent is extended or adjusted under 35 U.S.C. 154(b) by 124 days.

(21) Appl. No.: 10/255,972

(22) Filed: Sep. 26, 2002

(65) Prior Publication Data

US 2003/0228715 A1 Dec. 11, 2003

Related U.S. Application Data

(60) Provisional application No. 60/386,525, filed on Jun. 5, 2002.

(51) Int. Cl.[7] ................................................ H01L 21/00

(52) U.S. Cl. .......................... 438/149; 438/62; 438/907

(58) Field of Search ................................ 438/149–166, 438/62, 907

(56) References Cited

U.S. PATENT DOCUMENTS 3,657,613 A * 4/1972 Brody et al. .................. 257/66
4,450,786 A * 5/1984 Doehler et al. ............. 118/719
4,592,306 A * 6/1986 Gallego ...................... 118/719
4,615,781 A * 10/1986 Boudreau .................. 427/96.8
5,250,467 A * 10/1993 Somekh et al. ............. 438/643
6,281,552 B1 * 8/2001 Kawasaki et al. .......... 257/350
6,384,529 B2 * 5/2002 Tang et al. ................. 313/506
6,489,176 B2 * 12/2002 Ninomiya .................... 438/30
6,582,504 B1 * 6/2003 Fujita ......................... 106/311
6,677,174 B2 * 1/2004 Kim et al. .................... 438/22
6,791,258 B2 * 9/2004 Haase et al. ................ 313/501
2002/0009538 A1 * 1/2002 Arai ............................ 427/66
2002/0179013 A1 * 12/2002 Kido et al. ................. 118/718

OTHER PUBLICATIONS

T. Peter Brody; The birth and early childhood of active matrix—A personal memoir; Journal of SID, 4/3, 1996; pp. 113–127.

Peter Brody and Derrick Page; Flexible thin–film transistors stretch performance, shrink cost; Electronic Magazine; Sep. 1968; pp. 2–5.

T.P. Brody, Juris A. Asars and G. Douglas Dixon; A 6×6 Inch 20 Lines–per–Inch Liquid–Crystal Display Panel; IEEE Transactions on Electron Devices, vol. ED–20, No. 11, Nov. 1973; pp. 995–1001.

T.P. Brody, Fang Chen Luo, Zoltan P. Szepesi and David H. Davies; A 6×6–in 20–lpi Electroluminescent Display Panel; IEEE Transactions on Electron Devices, vol. ED–22, No. 9, Sep. 1975; pp. 739–748.

* cited by examiner

*Primary Examiner*—John F. Niebling
*Assistant Examiner*—Jennifer M. Kennedy
(74) *Attorney, Agent, or Firm*—Webb Ziesenheim Logsdon Orkin & Hanson, P.C.

(57) ABSTRACT

An electronic device is formed from electronic elements deposited on a substrate. The electronic elements are deposited on the substrate by advancing the substrate through a plurality of deposition vacuum vessels, with each deposition vacuum vessel having at least one material deposition source and a shadowmask positioned therein. The material from at least one material deposition source positioned in each deposition vacuum vessel is deposited on the substrate through the shadowmask positioned in the deposition vacuum vessel to form on the substrate a circuit comprised of an array of electronic elements. The circuit is formed solely by the successive deposition of materials on the substrate.

18 Claims, 9 Drawing Sheets

ACTIVE MATRIX BACKPLANE FOR CONTROLLING CONTROLLED ELEMENTS AND METHOD OF MANUFACTURE THEREOF

CROSS REFERENCE TO RELATED APPLICATIONS

This application claims priority from U.S. Provisional Patent Application Ser. No. 60/386,525, filed Jun. 5, 2002, entitled "Flexible Organic Light Emitting Diode Array and Method of Manufacture Thereof".

BACKGROUND OF THE INVENTION

1. Field of the Invention

The present invention relates to a substrate having electronic elements formed thereon which can be utilized for controlling controlled elements and a method of manufacturing the electronic elements on the substrate. The present invention also relates to a substrate having electronic elements and controlled elements formed thereon, where the electronic elements can be operated to control the controlled elements, and a method of manufacturing the electronic elements and the controlled elements on the substrate.

2. Description of Related Art

Active matrix backplanes are widely used in flat panel displays for routing signals to pixels of the display to produce viewable pictures. Presently, active matrix backplanes for flat panel displays are formed by performing a series of processes. Exemplary processing steps to produce a poly-silicon active matrix backplane include the following steps:

Poly-silicon Backplane Fabrication

| Step | Process |
|---|---|
| 1 | Clean bottom glass |
| 2 | Inspect |
| 3 | Si Deposit |
| 4 | Photoresist Coat |
| 5 | Soft bake |
| 6 | Expose |
| 7 | Develop |
| 8 | Hard Bake |
| 9 | Etch |
| 10 | Strip |
| 11 | Anneal/dehydrogenate |
| 12 | Laser recrystalize |
| 13 | Insulator (SiO2) Deposit |
| 14 | SiNx Deposit |
| 15 | Gate Metal Deposit |
| 16 | Photoresist Coat |
| 17 | Soft Bake |
| 18 | Expose |
| 19 | Develop |
| 20 | Hard Bake |
| 21 | Etch |
| 22 | Strip |
| 23 | Anodize gate metal |
| 24 | Ion Doping |
| 25 | Dopant activation |
| 26 | Bus line metal deposit |
| 27 | Photoresist Coat |
| 28 | Expose |
| 29 | Soft Bake |
| 30 | Expose |
| 31 | Develop |
| 32 | Hard Bake |
| 33 | Etch |
| 34 | Strip |
| 35 | Deposit ITO |
| 36 | Photoresist Coat |
| 37 | Soft Bake |
| 38 | Expose Pixel Electrode |
| 39 | Develop |
| 40 | Hard Bake |
| 41 | Etch |
| 42 | Strip |
| 43 | Photoresist Coat |
| 44 | Soft Bake |
| 45 | Expose contact open |
| 46 | Develop |
| 47 | Hard Bake |
| 48 | Etch |
| 49 | Strip |
| 50 | SiNx Passivation Deposit |
| 51 | Photoresist Coat |
| 52 | Soft Bake |
| 53 | Expose contact open |
| 54 | Develop |
| 55 | Hard Bake |
| 56 | Etch |
| 57 | Strip |
| 58 | Interconnect metal deposit |
| 59 | Photoresist Coat |
| 60 | Soft Bake |
| 61 | Expose metal |
| 62 | Develop |
| 63 | Hard Bake |
| 64 | Etch |
| 65 | Strip |

As can be seen, the poly-silicon active matrix backplane fabrication process includes numerous deposition and etching steps in order to define appropriate patterns of the backplane.

Because of the number of steps required to form a poly-silicon active matrix backplane, foundries of adequate capacity for volume production of poly-silicon backplanes are very expensive. The following is a partial list of exemplary equipment needed for manufacturing poly-silicon active matrix backplanes.

| Equipment | |
|---|---|
| Glass-handling | Wet/dry strip |
| Glass cleaning | Wet clean |
| Plasma CVD | Laser Crystallization |
| Sputtering | Ion Implant |
| Resist Coater | Resist stripping |
| Developer | Particle inspection |
| Exposure systems | Array filet/repair |
| Dry etch system | Anti-ESD equipment |
| Wet etch system | Clean oven |

Because of the nature of the poly-silicon active matrix backplane fabrication process, the foregoing equipment must be utilized in a class one (1) or class ten (10) clean room. In addition, because of the amount of equipment needed and the size of each piece of equipment the clean room must have a relatively large area which can be relatively expensive.

Moreover, poly-silicon is reproduced by recrystallization of amorphous silicon. This results in non-uniform grain size and carrier mobility, which then also translates into poor control of thin film transistor threshold voltages, particularly in large size circuits. These factors have so far limited the use of poly-silicon to small area backplanes used in LCD projectors.

It is, therefore, an object of the present invention to overcome the above limitations and others by providing an electronic device that includes a substrate having electronic elements formed thereon, which can be utilized for controlling controlled elements wherein the process of forming the electronic elements on the substrate is less complicated and less expensive than the process of forming electronic elements on backplanes using the poly-silicon active matrix backplane fabrication process described above. Still other objects will become apparent to those of ordinary skill in the art upon reading and understanding the following detailed description.

SUMMARY OF THE INVENTION

The present invention is a method of forming an electronic device. The method includes providing a substrate and depositing semiconductor material, conductive material and insulating material on the substrate through shadowmasks in the presence of a vacuum. The insulating material, the semiconductor material and the conductive material co-act to form an electronic element on the substrate.

The substrate can be flexible, transparent, electrically non-conducting or electrically conducting with an electrical insulator disposed between the electronic element and the electrically conductive part of the substrate.

The electronic element can be a thin film transistor. The method can also include depositing light emitting material on the substrate through a shadowmask in the presence of a vacuum in a manner whereby the light emitting material emits light in response to a control signal applied to the thin film transistor a diode, a memory element or a capacitor.

The invention is also a method of forming an electronic device that includes advancing a substrate through a plurality of deposition vacuum vessels, with each deposition vacuum vessel having at least one material deposition source and a shadowmask positioned therein. Material from the at least one material deposition source positioned in each deposition vacuum vessel is deposited on the substrate through the shadowmask positioned in the deposition vacuum vessel to form on the substrate a circuit comprised of an array of electronic elements. The circuit is formed solely by the successive deposition of materials on the substrate.

The plurality of deposition vacuum vessels can be interconnected. The substrate can be an elongated sheet that is advanced along its length through the plurality of deposition vacuum vessels whereupon at least one part of the substrate advances sequentially through each deposition vacuum vessel wherein it receives deposits of materials from the deposition sources positioned in the deposition vacuum vessels.

The substrate can include along its length a plurality of spaced portions which can be advanced through the plurality of vacuum vessels whereupon each portion receives a deposit of material from the deposition source positioned in each vacuum vessel.

Where the electronic elements are thin film transistors, the depositing step includes, for each thin film transistor: depositing a layer of semiconductor material, e.g., Cadmium Selenide, Tellurium, Indium—Arsenide, or the like, on the substrate; depositing a first layer of semiconductor compatible conductive material, e.g., Gold-Indium, relative to the semiconductor material and the substrate in a manner to form therewith a source and drain of the thin film transistor; depositing a first insulator layer relative to the semiconductor material, the source and the drain in a manner to form therewith a gate insulator; and depositing as second layer of conductive compatible conductive material, e.g., Gold-Indium, relative to the gate insulator, the semiconductor material, the source and the drain in a manner to form therewith a gate of the thin film transistor. A second insulator layer can be deposited relative to the second layer of conductive material and the first insulator layer in a manner whereupon at least part of the second layer of conductive material is exposed through a window in the second insulator layer. A third layer of semiconductor compatible conductive material can be deposited relative to the second layer of conductive material and through the window in the second insulator layer to form an output pad.

The first conductive material can be deposited in a manner to form with one of the source and the drain of at least one thin film transistor a first address bus and the second conductive material can be deposited in a manner to form with the other of the source and the drain of the at least one thin film transistor a second address bus. Each address bus is individually addressable. Each thin film transistor in a column or a row of the array of thin film transistors forming the circuit is connected to a common address bus.

The circuit can also include a plurality of deposited light emitting elements, with the thin film transistors disposed between the substrate and the light emitting elements.

To form each light emitting element, a hole transport material is deposited on the substrate in electrical communication with a power terminal of the thin film transistor associated with the light emitting element. Next, a light emitting material of each light emitting element is deposited over at least part of the hole transport material in alignment with or adjacent to the power terminal associated with the thin film transistor for the light emitting element. An electron transport material of each light emitting element is then deposited over at least part of the light emitting material of each light emitting element. Lastly, a conductive material of each light emitting element is deposited over at least part of the electron transport material thereof.

DETAILED DESCRIPTION OF THE INVENTION

The present invention is an electronic device that includes one or more electronic elements deposited on a substrate for controlling one or more controlled elements that may be separate from or an integral part of the electronic device and a method of manufacture thereof. In the following description, the electronic device described is an active matrix backplane having an array of organic light emitting diodes (OLEDs) which are deposited on the active matrix backplane and which are selectively controlled thereby. However, this is not to be construed as limiting the invention since any type of electronic element, such as a thin film transistor, a diode, a capacitor or a memory element, can be formed on the substrate for controlling any type of controlled element that may, or may not, be formed on the substrate. The present invention will now be described with reference to the accompanying figures where like reference numbers correspond to like elements.

Figure 1:
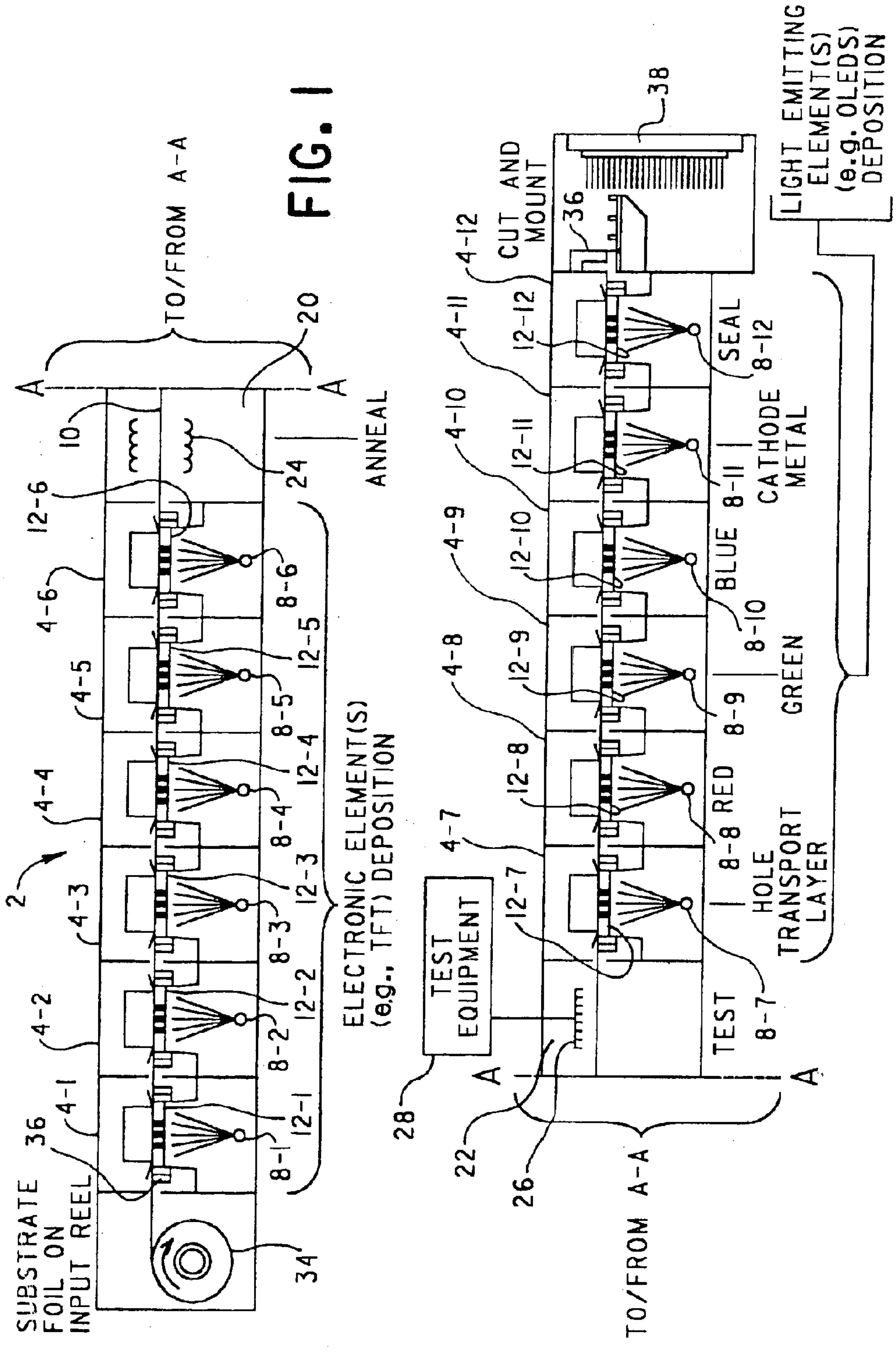
FIG. 1 is a diagrammatic side view of an exemplary in-line production system for the manufacture of electronic elements and controlled elements on a substrate in accordance with the present invention.

With reference to FIG. 1, an exemplary production system 2 for producing an electronic device in accordance with the present invention, e.g., an active matrix backplane having OLEDs thereon, includes a plurality of vacuum vessels connected in series. The plurality of vacuum vessels includes a plurality of deposition vacuum vessels 4, an annealing vacuum vessel 20 and a test vacuum vessel 22. Each deposition vacuum vessel 4 includes a deposition source 8 that is charged with a desired material to be deposited onto a substrate 10 via a shadowmask 12 which is also positioned in the deposition vacuum vessel 4.

Figure 2:
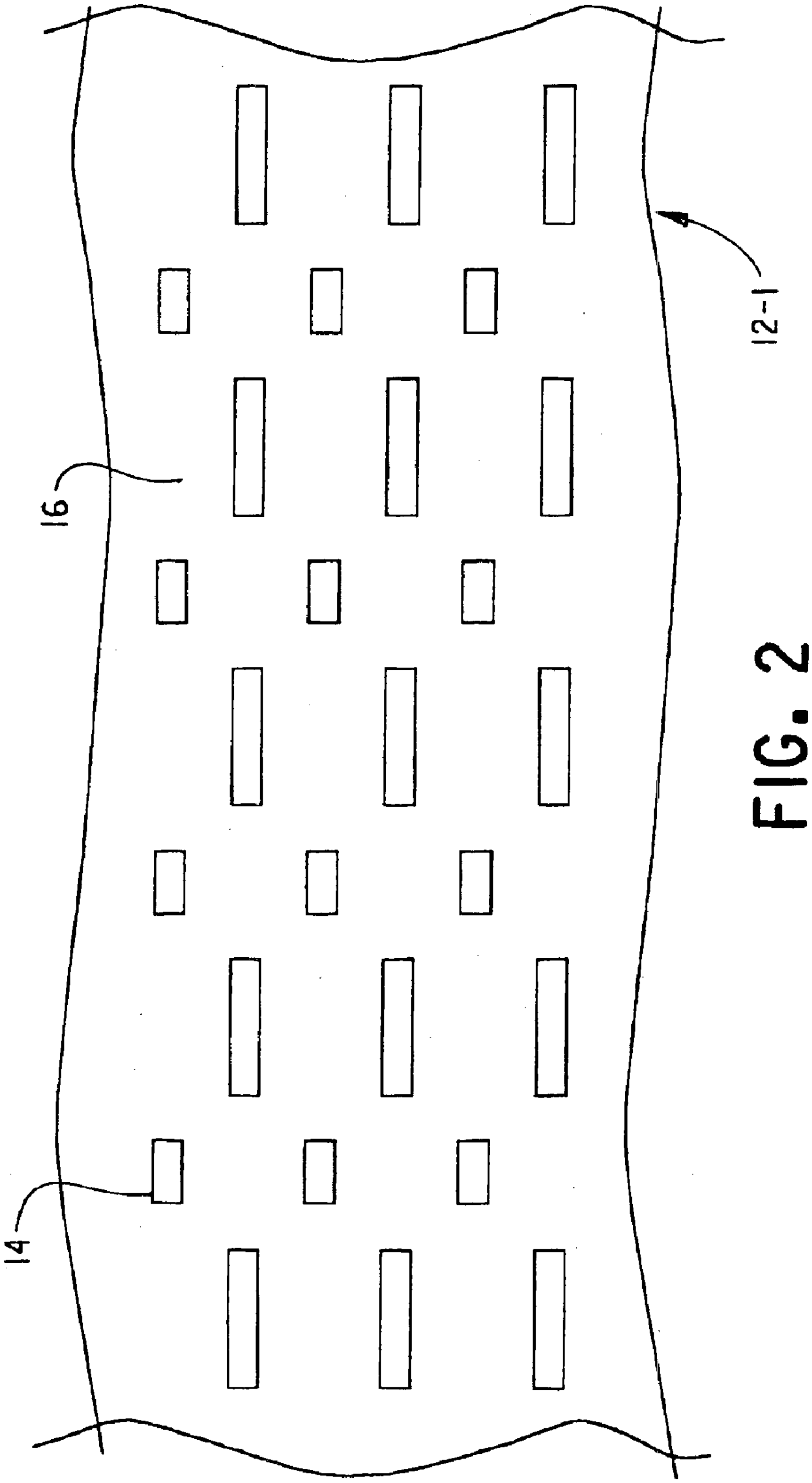
FIG. 2 is a view of an isolated portion of a shadowmask utilized in the production system shown in FIG. 1.

Each shadowmask 12-1–12-12 includes a pattern of apertures 14, e.g., slots, holes, etc., formed in a sheet 16. FIG. 2 shows a view of shadowmask 12-1 from the perspective of deposition source 8-1 of deposition vacuum vessel 4-1.The pattern of apertures 14 formed in sheet 16 of each shadowmask 12-1–12-12 corresponds to a desired pattern of material to be deposited on substrate 10 from deposition sources 8-1–8-12 in deposition vacuum vessel 4-1–4-12, respectively, as substrate 10 is advanced through each deposition vacuum vessel 4-1–4-12.

In the embodiment of production system 2 illustrated in FIG. 1, vacuum vessels 4-1–4-6 are utilized for depositing materials on substrate 10 to form one or more electronic elements on substrate 10. Each electronic element can be a thin film transistor (TFT), a diode, a memory element or a capacitor. For purpose of the following description, the one or more electronic elements will be described as a matrix of TFTs. However, this is not to be construed as limiting the invention. Vacuum vessels 4-7–4-11 are utilized for depositing materials on substrate 10 that form one or more controlled elements, e.g., OLEDs, that can be controlled by the TFT matrix deposited in deposition vacuum vessels 4-1–4-6. Deposition vacuum vessel 4–12 is utilized for depositing a protective seal over substrate 10 to protect the TFT matrix and the controlled elements deposited thereon from moisture and undesirable foreign particles, such as dust, dirt, and the like. If the one or more electronic elements deposited in deposition vacuum vessels 4-1–4-6 are to be utilized to control controlled elements not deposited on substrate 10 in vacuum vessels 4-7–4-11, these vacuum vessels 4-7–4-11 can be omitted and deposition vacuum vessel 4-12 can be positioned to receive substrate 10 when it is advanced from test vacuum vessel 22. Alternatively, vacuum vessels 22 and 4-7–4-12 can be omitted and a storage vessel 39 can be positioned to receive substrate 10 when it is advanced from anneal vacuum vessel 20. For purpose of illustration, deposition vacuum vessels 4-7–4-11 will be described as depositing the materials necessary to form OLEDs on substrate 10. However, this is not to be construed as limiting the invention. In addition, the number, purpose and arrangement of vacuum vessels 4, 20 and 22 is not to be construed as limiting the invention since such number, purpose and arrangement of vacuum vessels 4, 20 and 22 can be modified as needed by one of ordinary skill in the art for depositing one or more materials required for a particular application.

Anneal vacuum vessel 20 is positioned to receive substrate 10 when it is advanced from deposition vacuum vessel 4-6. Anneal vacuum vessel 20 includes heating elements 24 which are utilized to heat the materials deposited on substrate 10 in deposition vacuum vessels 4-1–4-6 to a suitable annealing temperature. After annealing, substrate 10 is advanced into test vacuum vessel 22 which includes a probe assembly 26 having probes (not shown) which can be moved into contacting or non-contacting relation, as required, with the TFT matrix deposited on substrate 10 for testing by test equipment 28.

When testing of the TFT matrix on substrate 10 in test vacuum vessel 22 is complete, substrate 10 is advanced through deposition vacuum vessels 4-7–4-12 where the materials forming the OLEDs are deposited on the TFT matrix and the seal coat is deposited over the TFT matrix and OLEDs.

Each vacuum vessel 4, 20 and 22 is connected to a source of vacuum (not shown) for establishing a suitable vacuum therein. More specifically, the source of vacuum establishes a suitable vacuum in deposition vacuum vessels 4-1–4-12 to enable a charge of desired material positioned in deposition sources 8-1–8-12 to be deposited on substrate 10 in a manner known in the art, e.g., sputtering, vapor phase deposition, etc., through the apertures 14 of the sheets 16 of shadowmasks 12-1–12-12.

In the following description of exemplary production system 2, substrate 10 will be described as being a continuous flexible sheet which is initially disposed on a dispensing reel 34 that dispenses substrate 10 into deposition vacuum vessel 4-1. Dispensing reel 34 is positioned in a preload vacuum vessel 35 which is connected to a source of vacuum (not shown) for establishing a suitable vacuum therein. However, production system 2 can be configured to continuously process a plurality of individual substrates 10. Each deposition vacuum vessel 4 includes supports or guides 36 that avoid sagging of substrate 10 as it is advanced through deposition vacuum vessels 4-1–4-12.

In operation of production system 2, the material positioned in each deposition source 8-1–8-12 is deposited on substrate 10 in the presence of a suitable vacuum as substrate 10 is advanced through deposition vacuum vessel 4-1–4-12 whereupon plural progressive patterns are formed on substrate 10. More specifically, substrate 10 has plural portions that are positioned for a predetermined interval in each vacuum vessel 4, 20 and 22. During this predetermined interval, material is deposited from one or more of the deposition sources 8 onto the portion of substrate 10 positioned in the corresponding deposition vacuum vessel 4, the materials deposited on the portion of substrate 10 positioned in anneal vacuum vessel 20 are annealed and the TFT matrix deposited on the portion of the substrate 10 positioned in test vacuum vessel 22 is tested. After this predetermined interval, substrate 10 is step advanced whereupon the plural portions of substrate 10 are advanced to the next vacuum vessel 4, 20 or 22 in series for additional processing, as applicable. This step advancement continues until each portion of substrate 10 has passed through all of vacuum vessels 4, 20 and 22. Thereafter, each portion of substrate 10 exiting deposition vacuum vessel 4-12 is separated from the remainder of substrate 10 by cutter 36 whereafter this cut portion of substrate 10 is stored flat on a suitable storage means 38 positioned in a storage vacuum vessel 39. Alternatively, each portion of substrate 10 exiting deposition vacuum vessel 4-12 is received on a take-up reel (not shown) positioned in a storage vacuum vessel 39. Storage vacuum vessel 39 is connected to a source of vacuum (not shown) for establishing a suitable vacuum therein.

The description of substrate 10 as being a continuous flexible sheet is not to be construed as limiting the invention since substrate 10 can also be rigid and/or of any desired size or shape, e.g., one or more individual sheets, that can be positioned concurrently in one or more vacuum vessels 4, 20 and 22. For example, substrate 10 can be rigid and in the form of an elongated rectangle that can be positioned in one or more vacuum vessels 4, 20 and 22.

Next, a sequence of steps utilized to form an active matrix OLED display will be described with reference to FIGS. 3–9 and with continuing reference to FIG. 1.

Figure 3:
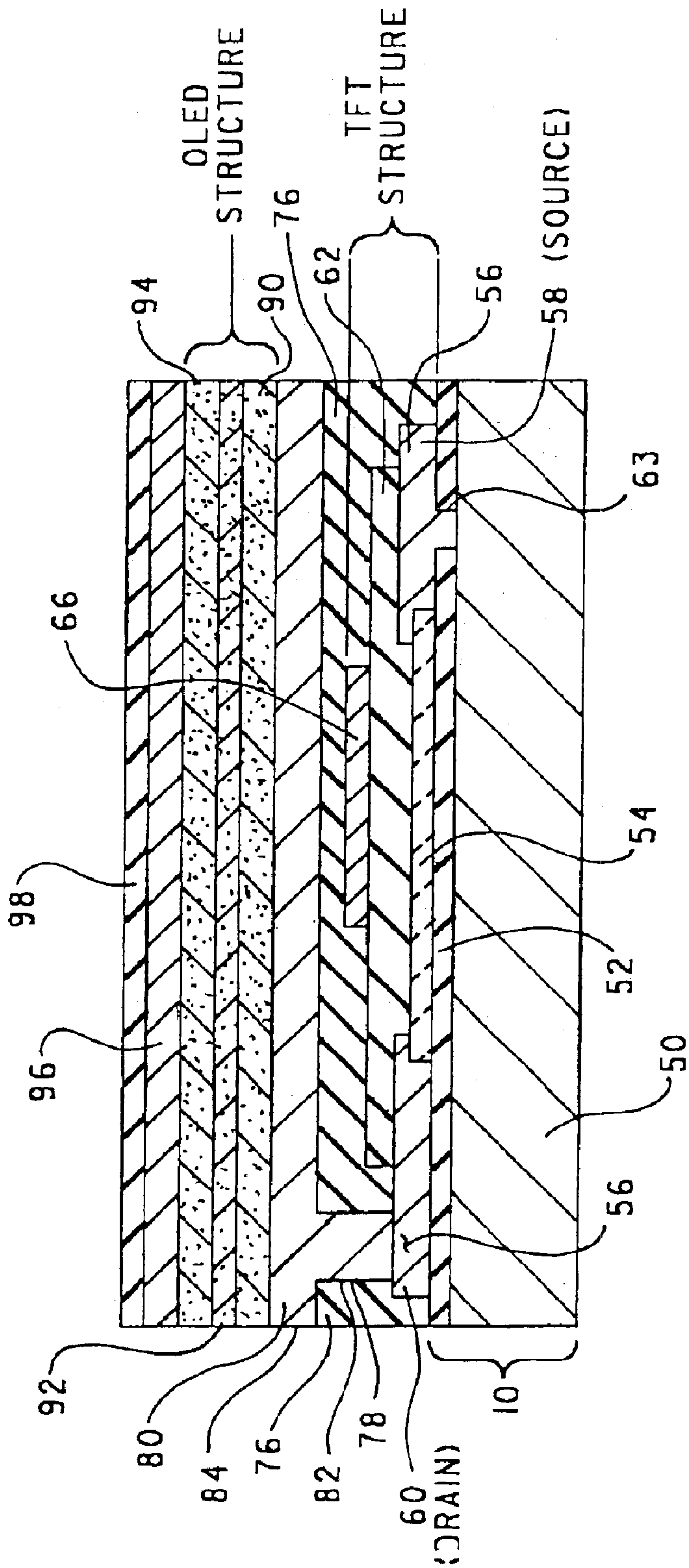
FIG. 3 is a cross-sectional view of a portion of the substrate shown in FIG. 1 having an electronic element and a controlled element deposited thereon via the production system shown in FIG. 1.
Figure 4:
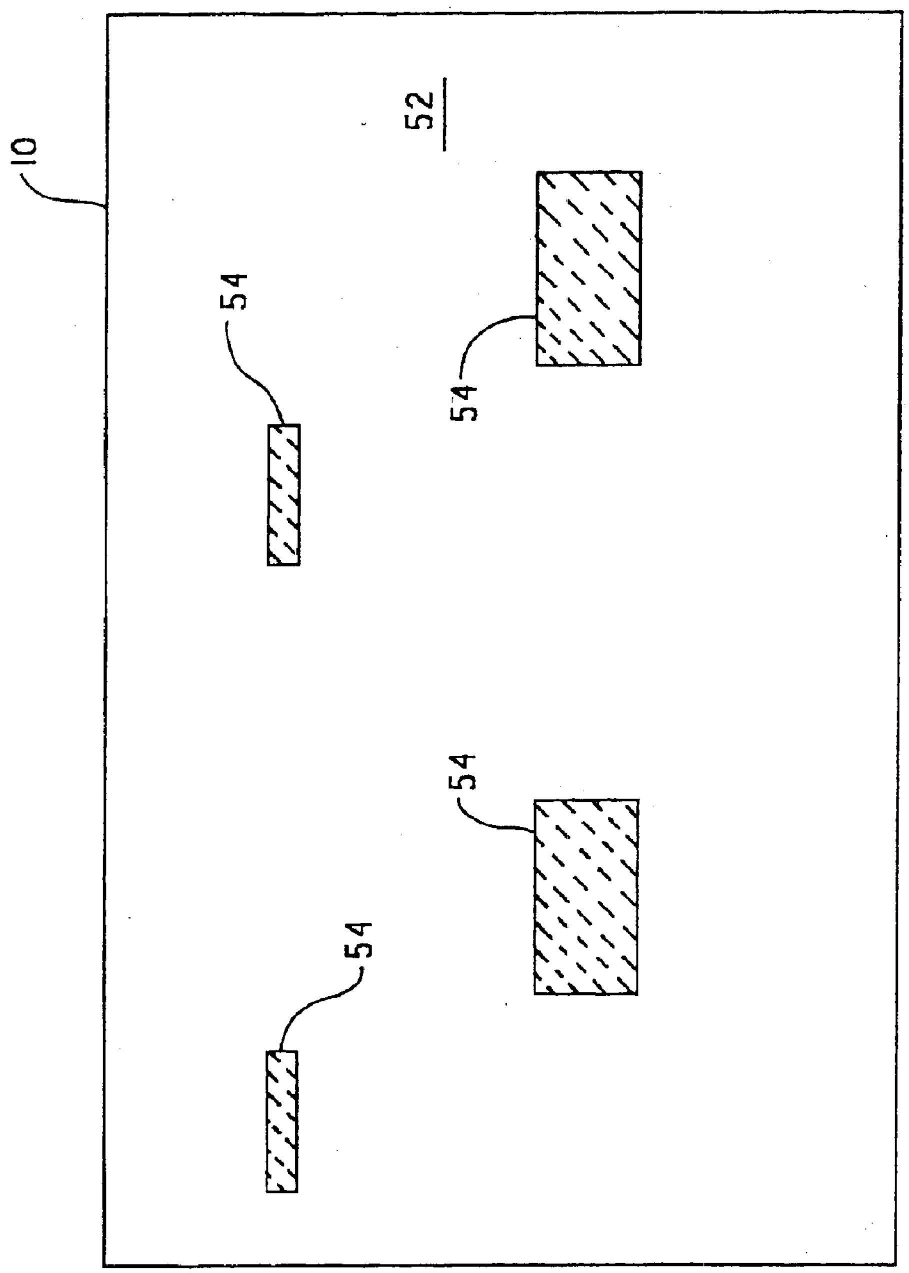
FIGS. 4–9 are views of a sequential deposition of materials on a portion of substrate in FIG. 1 to form electronic elements thereon via the production system shown in FIG. 1.

As shown in FIG. 3, substrate 10 includes an electrically conductive layer 50 having an insulator 52 on one surface thereof. A portion of substrate 10 is fed into deposition vacuum vessel 4-1 with electrical insulator layer 52 facing deposition source 8-1. In this exemplary deposition sequence, deposition 8-1 source is charged with a semiconductor material 54. This semiconductor material 54 is deposited by deposition source 8-1 on the surface of electrical insulator layer 52 opposite electrically conductive layer 50 through shadowmask 12-1. FIG. 4 shows an isolated view of the portion of substrate 10 that received the deposit of semiconductor material 54 on the surface of electrical insulator 52 to form pairs of transistors 70 and 74, shown best in FIG. 7.

The alignment of each shadowmask 12 to the portion of substrate 10 positioned in the corresponding deposition vacuum vessel 4 is critical. To this end, the portion of substrate 10 positioned in each deposition vacuum vessel 4 can include one or more fiducial marks or points (not shown) that an aligning means (not shown) positioned in each deposition vacuum vessel 4 can utilize for positioning the corresponding shadowmask 12 relative to the portion of substrate 10 received in the deposition vacuum vessel 4. Each aligning means can include optical or mechanical means for determining a position of the corresponding shadowmask to the fiducial marks on the portion of substrate 10 received in the corresponding deposition vacuum vessel 4. Each aligning means can also include drive means coupled to the corresponding shadowmask to perform x and y positioning of the shadowmask 12 relative to the one or more fiducial marks on the portion of substrate 10. This drive means can also include means for moving the shadowmask 12 into contact with the portion of substrate 10 for deposition of material thereon. Once the deposition of material onto substrate 10 in each deposition vacuum vessel 4 is complete, the drive means can separate the corresponding shadowmask 12 from the portion of substrate 10 received therein. This separation avoids shadowmask 12 from contacting the materials deposited on substrate 10 as substrate 10 is advanced into the next vacuum vessel 4, 20 or 22.

After deposition of semiconductor material 54 on electrical insulator layer 52 in deposition vacuum vessel 4-1, the portion of substrate 10 in deposition vacuum vessel 4-1 is advanced into deposition vacuum vessel 4-2. Deposition source 8-2 in deposition vacuum vessel 4-2 is charged with a semiconductor compatible conductive material 56 which is deposited on the portion of substrate 10 in deposition vacuum vessel 4-2 via shadowmask 12-2 to form the pattern of conducting material 56 shown in FIG. 5.

If substrate 10 has an elongated form, whereupon portions of substrate 10 can be positioned in two or more deposition vacuum vessels 4, 20 or 22, advancing the portion of substrate 10 from deposition vacuum vessel 4-1 into deposition vacuum vessel 4-2 advances another portion of substrate 10 into deposition vacuum vessel 4-1. In this manner, materials in different deposition vacuum vessels 4 can be deposited on different portions of substrate 10 at or about the same time. Similarly, annealing and testing of electronic elements deposited on various portions of substrate 10 can occur at or about the same time as one or more materials are being deposited on other portions of substrate 10. Thus, the exemplary production system 2 shown in FIG. 1 has the advantage of being able to simultaneously process plural portions of substrate 10 thereby maximizing the rate each portion of substrate 10 is processed to produce a completed electronic device.

Figure 5:
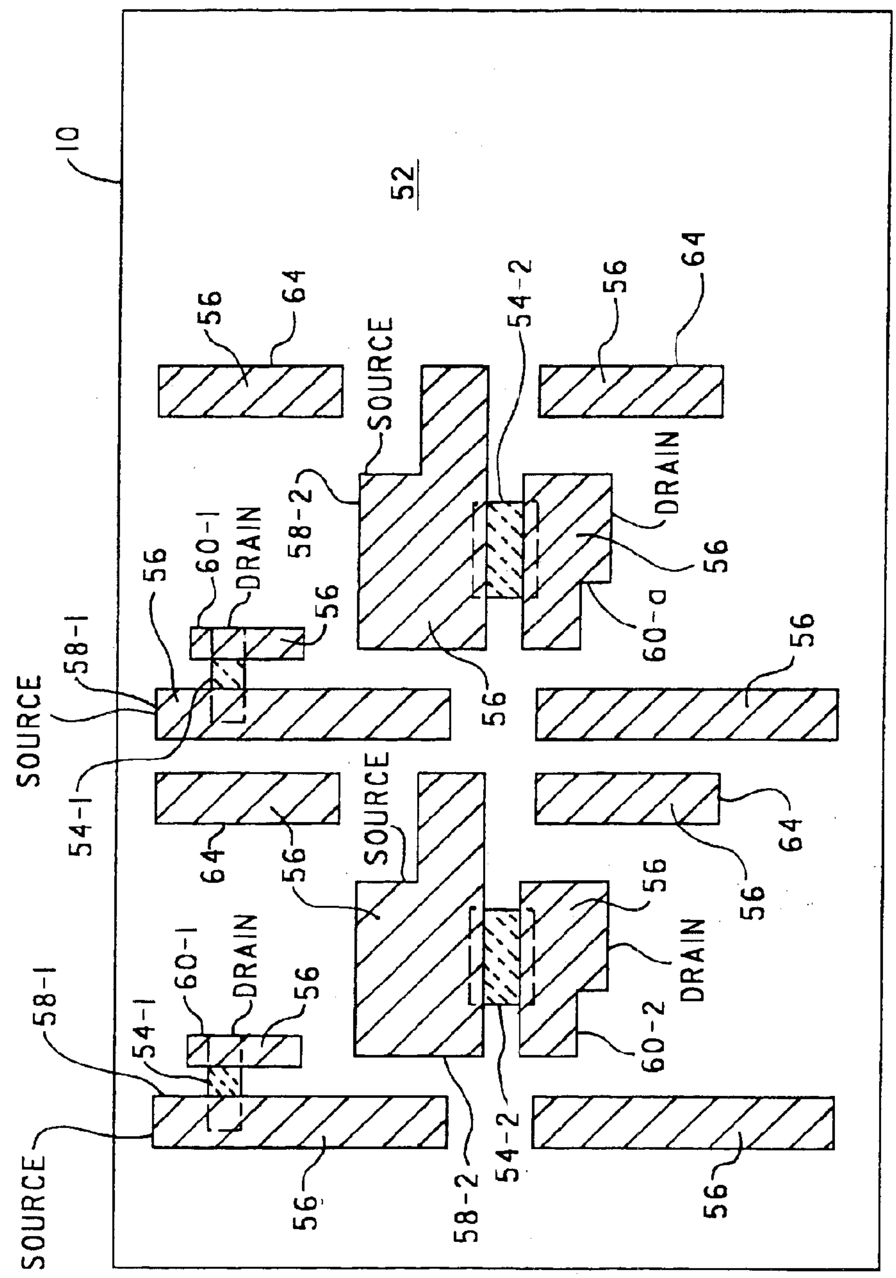

As shown in FIGS. 3 and 5, a portion of conducting material 56 is deposited overlapping opposite sides or opposite ends of semiconductor material portions 54-1–54-2 to define source structures 58-1 and 58-2 and drain structures 60-1–60-2 for transistors 74 and 70, respectively.

Electrically conductive layer 50 of substrate 10 can be utilized as a power or ground bus depending on the application. To this end, as shown in FIG. 3, conducting material 56 forming each source 58 can be in electrical communication with electrically conductive layer 50 of substrate 10 by way of a through-hole or via 63 in electrical insulator layer 52. The via 63 utilized to connect each source 58 to electrically conductive layer 50 can be formed in electrical insulator layer 52 prior to introducing substrate 10 into any vacuum vessels 4, 20 or 22.

In the foregoing description, each source 58 is described as being connected to electrically conductive layer 50 by way of via 63 in electrical insulator layer 52. However, each source 58 can be connected to electrically conductive layer 50 by way of two or more vias 63. Alternatively, depending on the application, each drain 60 can be connected to electrically conductive layer 50 by way of two or more vias 63 in electrical insulator layer 52 while each source 58 remains electrically isolated from electrically conductive layer 50 by electrical insulator layer 52. The decision to connect each source 58 or each drain 60 to electrically conductive layer 50 by way of one or more vias 63 in electrical insulator layer 52 is a decision that can be readily made by one of ordinary skill in the art depending upon, among other things, the intended use of the electronic elements formed on substrate 10 and/or the intended use of electrically conductive layer 50 as a power bus or a ground bus.

When the deposition of conducting material 56 is complete, the portion of substrate 10 in deposition vacuum vessel 4-2 is advanced to deposition vacuum vessel 4-3. Deposition source 8-3 is charged with an insulating material 62 which is deposited on the portion of substrate 10 positioned in deposition vacuum vessel 4-3 through shadowmask 12-3 in the pattern shown in FIG. 6.

Figure 6:
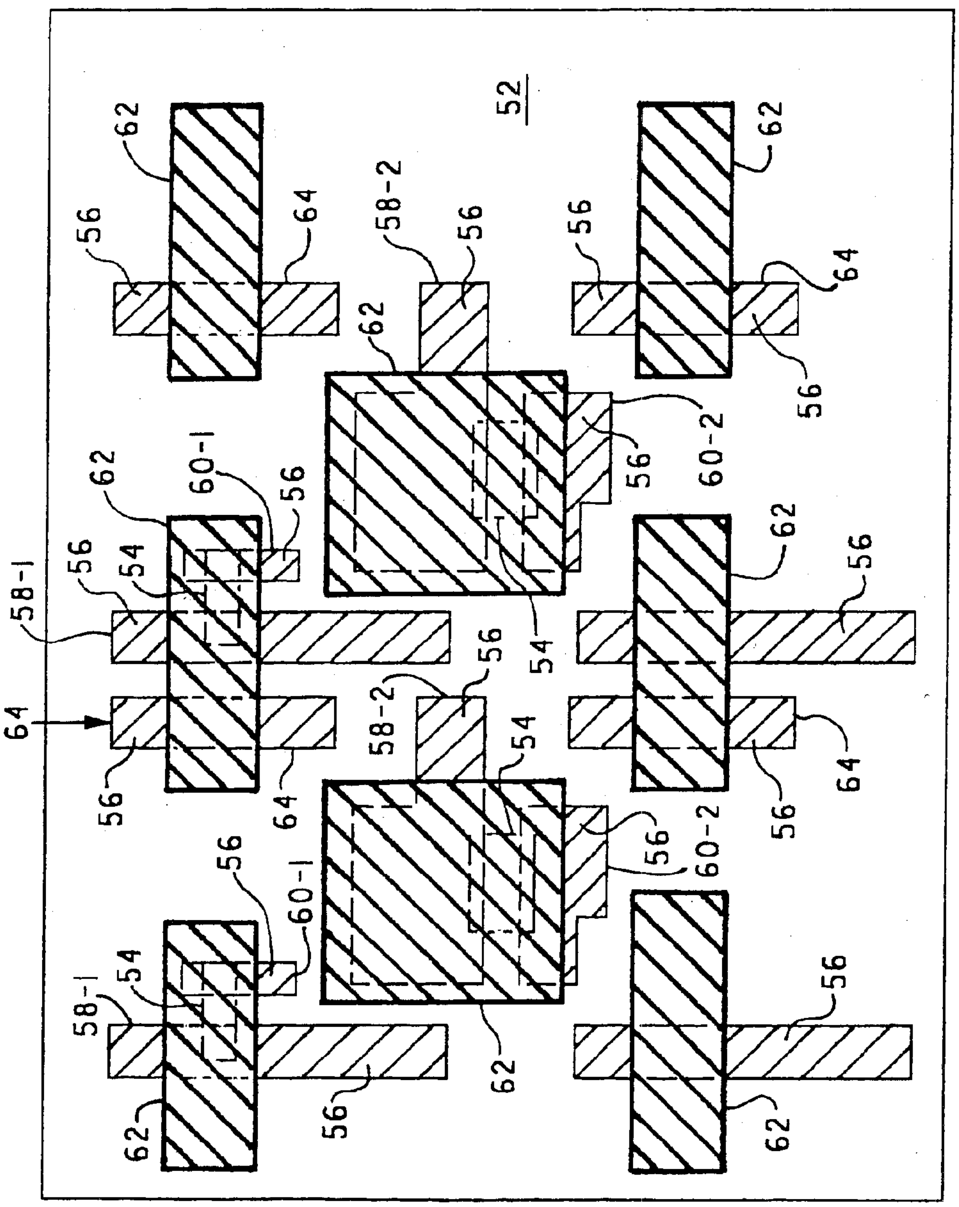

As shown in FIGS. 3 and 6, insulating material 62 can cover all or part of each source 58 and each drain 60 formed by the deposition of conducting material 56 over semiconductor material 54. In addition, insulating material 62 can also cover portions of conducting material 56 that are to comprise a power bus 64 for each source 58-2.

Next, the portion of substrate 10 positioned in deposition vacuum vessel 4-3 is advanced to deposition vacuum vessel 4-4. Deposition source 8-4 is charged with a conducting material 66 which is deposited on the portion of substrate 10 positioned in deposition vacuum vessel 4-4 through shadowmask 12-4 in the pattern shown in FIG. 7. The conducting material portion 66-4 overlapping the rightward extension of each source 58-2 and the conducting material 56 in alignment with the portion of conducting material 66-4 completes the power bus 64 for the source 58-2 and for any like sources (not shown) in the same column as source 58-2. The conducting material portion 66-3 to the left of each source 58-2 forms a column bus 68 for source 58-1 and for any like sources (not shown) in the same column as source 58-2. The conducting material portion 66-2 is connected to drain 60-1 and covers a portion of the insulating material 62 that partially covers source 58-2 and drain 60-2 and is in spaced parallel relation with semiconducting material 54-2. Conducting material portion 66-2 defines a gate structure 69 that together with source 58-2, drain 60-2, insulating material portion 62-2 and semiconductor material 54-2 forms transistor 70.

A conducting material portion 66-1 deposited above each transistor 70 overlapping the horizontally oriented insulating material portion 62-1 forms a row select bus 72. More specifically, conducting material portion 66-1 above each transistor 70 forms with source 58-1, drain 60-1, semiconductor material 54-1 and the insulating material 62-1 therebetween a transistor 74 that controls the conductive state of transistor 70 having its gate structure 69 coupled to drain 60-1 of transistor 74. For example, transistor 74-1 controls the conduction state of transistor 70-1, and transistor 74-2 controls the conduction state of transistor 70-2.

Figure 7:
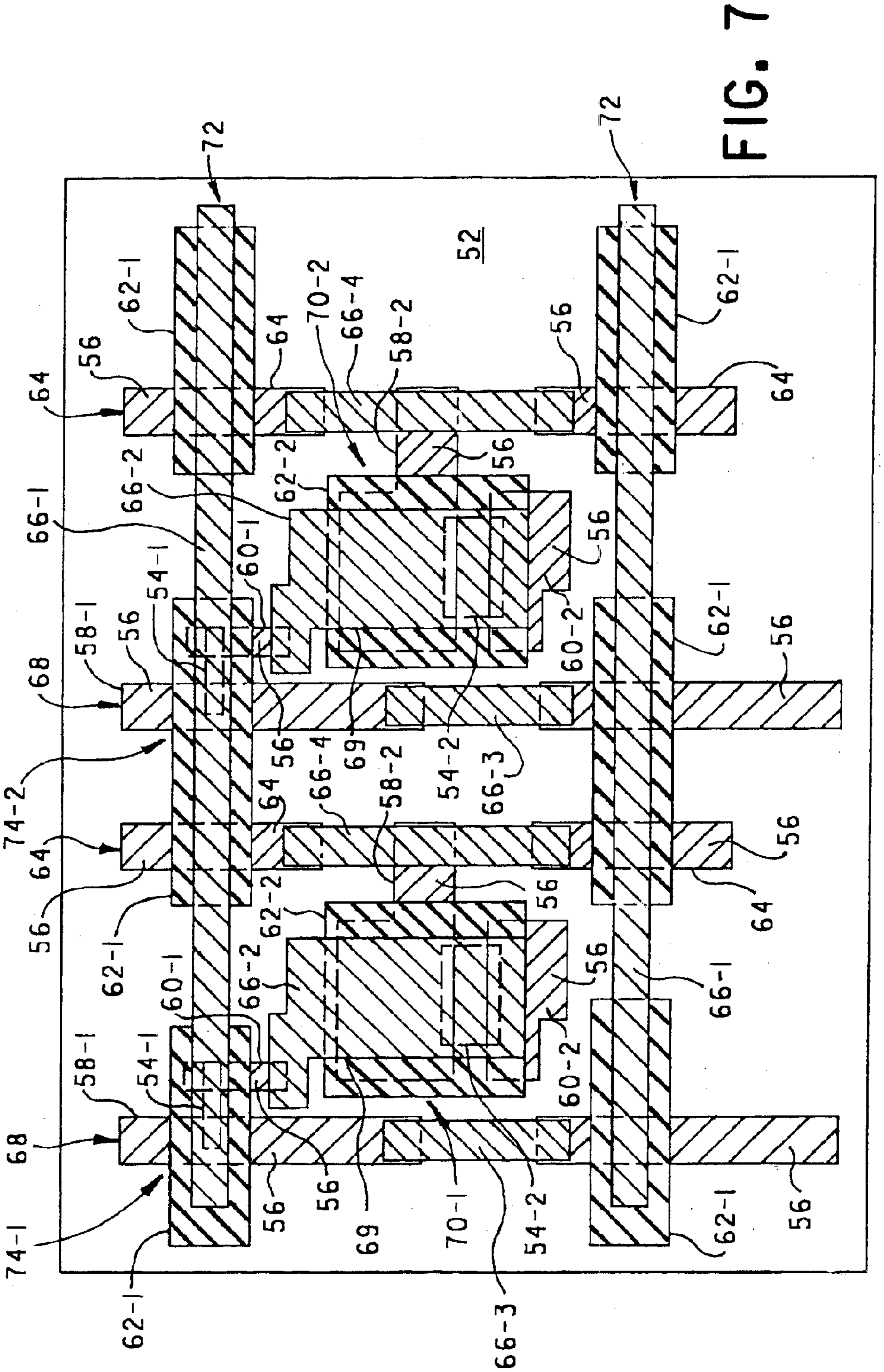

In FIG. 7, row select bus 72 below each illustrated transistor 70 is utilized to select the row of transistors 74 below those shown in FIG. 7. To this end, it is to be appreciated that FIG. 7 only shows an isolated portion of substrate 10 having only portions of the materials utilized to form two pairs of transistors 74 and 70. The materials utilized to form other pairs of transistors 74 and 70 of the active matrix have been omitted from FIGS. 4–9 for simplicity of illustration.

With continuing reference to FIG. 7, when row select bus 72 above transistors 70-1 and 70-2 is selected, transistor 70-1 and 70-2 are responsive to the voltages applied to the column buses 68 associated with each transistor 74-1 and 74-2, respectively. Thus, when an appropriate voltage is applied to row select bus 72 above the illustrated transistors 70, the voltage applied to sources 58-1 of transistor 74-1 and 74-2 via their corresponding column buses 68 control the amount of current flowing in transistor 70-1 and 70-2, respectively. Thus, by simply controlling the voltage applied to each column bus 68 when an appropriate voltage is applied to the corresponding row bus, the amount of current flowing in each transistor 70 can be selectively controlled.

It is to be appreciated that each instance of conducting material portion 66, source 58, drain 60 and insulating material portion 62 defines a capacitor. More specifically, conducting material portion 66 defines a first plate of a capacitor which insulating material portion 62 holds in spaced relation to source 58 and drain 60 which, individually or collectively, define a second plate of the capacitor. If the leakage current thereof is sufficiently low, each capacitor can be utilized as a binary memory element.

Figure 8:
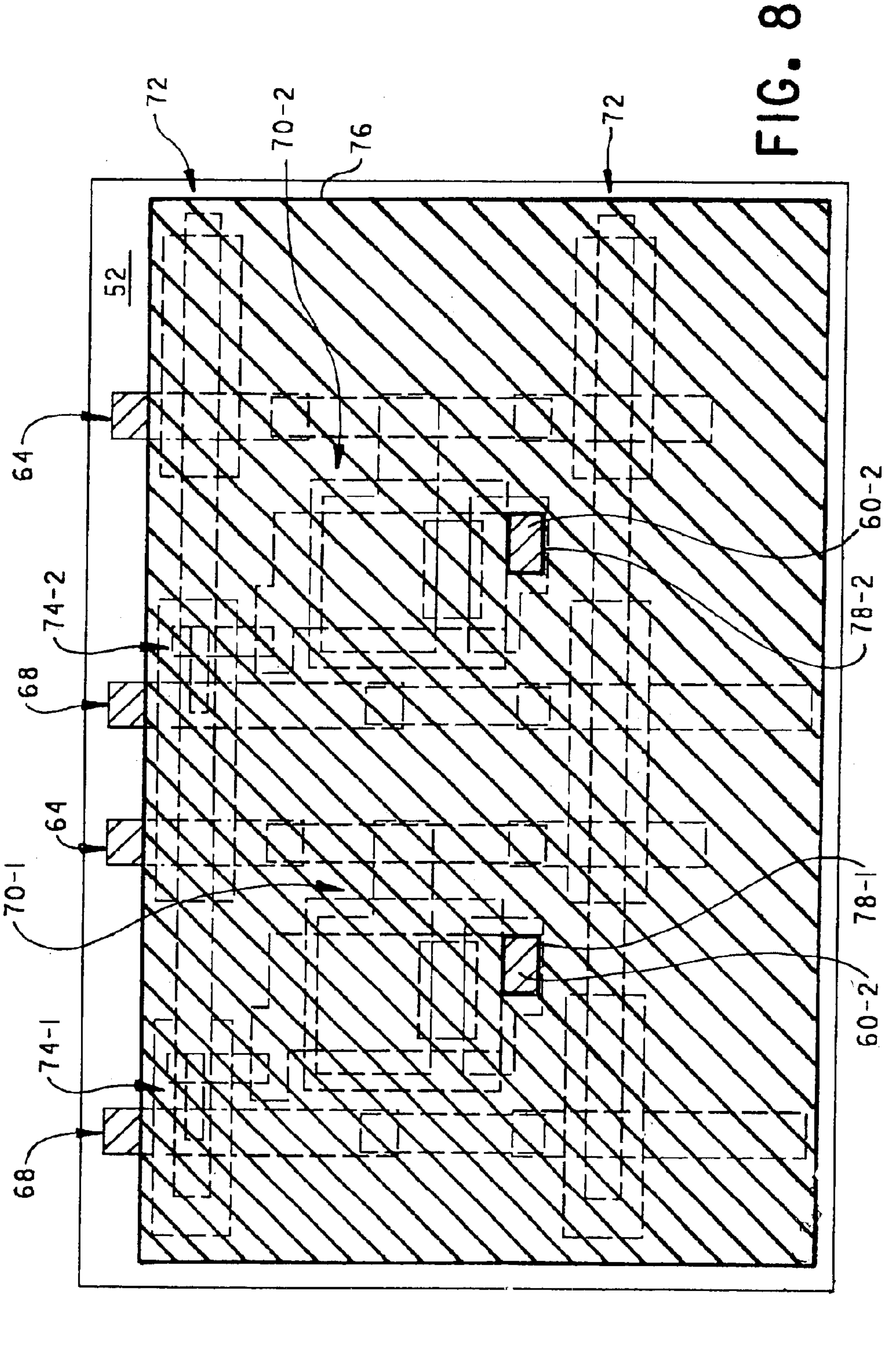
Figure 9:
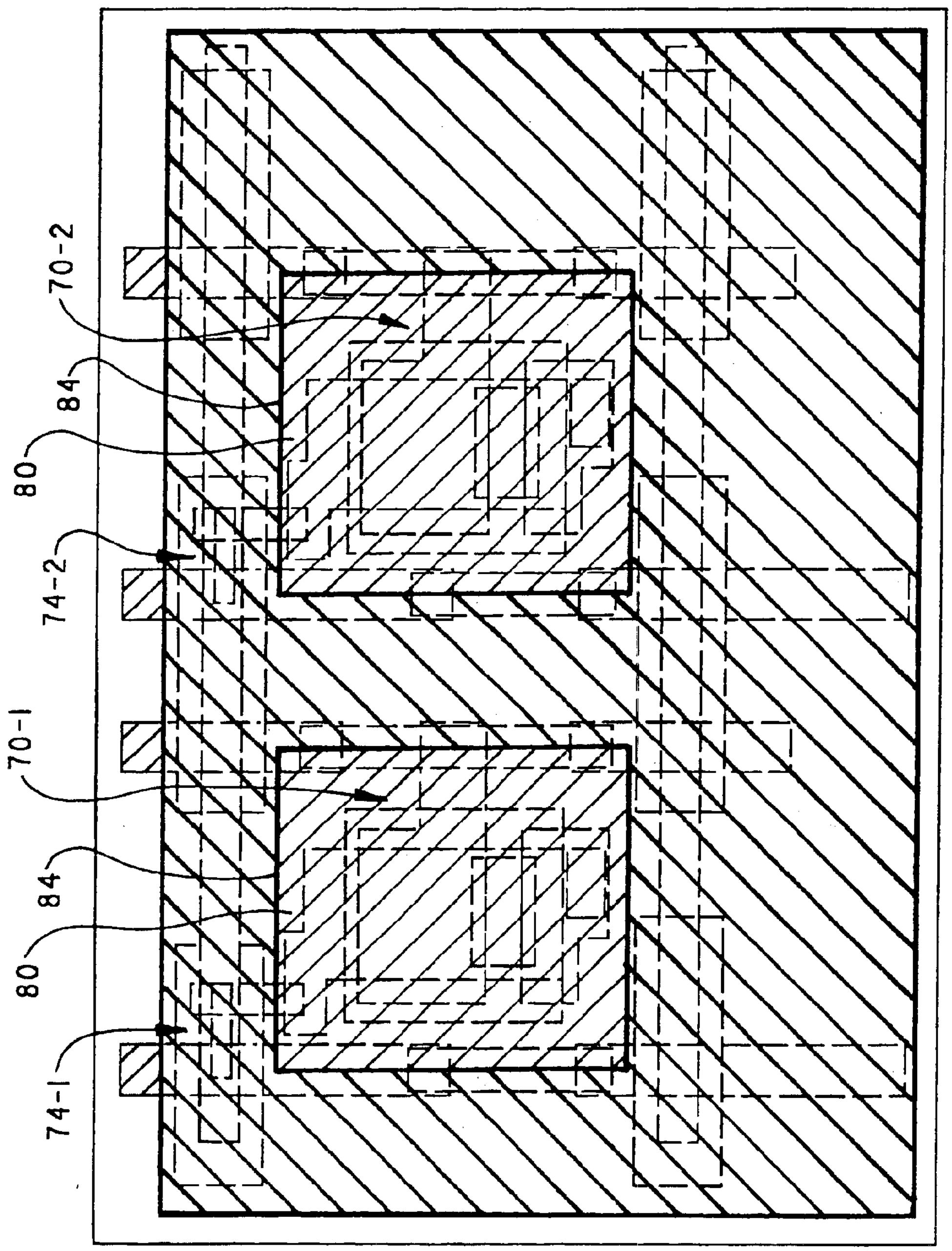

With reference to FIG. 8, and with ongoing reference to FIGS. 1 and 3–7, after the deposition of conducting material 66 is complete, the portion of substrate 10 in deposition vacuum vessel 4-4 is advanced into deposition vacuum vessel 4-5. Deposition source 8-5 is charged with an insulating material 76 which is deposited over substantially all of the material previously deposited on substrate 10 in the pattern shown in FIG. 8. In this pattern, however, portions 78-1 and 78-2 of drains 60-2 of transistor 70-1 and 70-2, respectively, are not covered by insulating material 76. In addition, the input ends of each power bus 64 and the input end of each column bus 68 are not covered by insulating material 76. Still further, the input end (not shown) of each row bus 72 is also not covered by insulating material 76. In the embodiment shown in FIGS. 4–9, the input end of each power bus 64 and the input end of each column bus 68 are at the top of the figure and the input end (not shown) of each row select bus 72 is to the right of the figure.

When the deposition of insulating material 76 is completed, the portion of substrate 10 in deposition vacuum vessel 4-5 is advanced into deposition vacuum vessel 4-6. Deposition source 8-6 is charged with a conducting material 80 that is deposited on substrate 10 through shadowmask 12-6 in the pattern shown in FIG. 9. As shown in FIG. 3, each portion 78 where insulating material 76 is not deposited in deposition vacuum vessel 4-5 defines a via through which conducting material 80 makes contact with drain 60-2 of the corresponding transistor 70. Conducting material 80 deposited above each transistor 70 defines an output pad 84, the voltage of which can be controlled by the associated pairs of transistors 70 and 74, e.g., transistors 70-1 and 74-1.

After conducting material 80 has been deposited, the portion of substrate 10 is advanced from deposition vacuum vessels 4-6 into anneal vacuum vessel 20 where one or more heating elements 24 are controlled to provide an appropriate annealing heat to the materials deposited on the portion of substrate 10 in deposition vacuum vessel 4-1–4-6.

The above described deposition steps and materials and the circuit produced thereby are for the purpose of illustration and are not to be construed as limiting the present invention since the deposition sequence, the deposition materials and/or the circuit produced thereby are matters of design choice that can be made by one of ordinary skill in the art. For example, the source and drain structures of each transistor can be reversed, the configuration and interconnections of the TFTs forming the circuit can be modified to suit a particular application, each TFT can be addressed individually or groups of TFT's can be addressed in any desired pattern, and so forth.

Each column bus 68 and row select bus 52 can be coupled to suitable row and column control logic (not shown) which can be formed on substrate 10 at the same time each transistor 70 and each transistor 74 is formed thereon. Specifically, each shadowmask 12 can include an appropriate pattern of apertures 14 in sheet 16 thereof which enable the formation on substrate 10 of appropriate row and column control logic at the same time each transistor 70 and each transistor 74 are formed thereon.

Depending upon the intended use of substrate 10 having plural thin film transistors 70 and 74 formed thereon, the annealing process may be the last step that the portion of substrate 10 receives. If so, the output of anneal vacuum vessel 20 is coupled to storage means 38 which stores the portion of substrate 10 for subsequent processing or use. However, if the portion of substrate 10 is to be exposed to additional processing steps, e.g., to form OLEDs on output pads 84, the portion of substrate 10 can be advanced into test vacuum vessel 22 for testing thereof.

In test vacuum vessel 22, the probes of probe assembly 26 are moved into contacting or non-contacting relation, as required, with the various buses 64, 68 and 72 and output pads 84. Thereafter, under the control of test equipment 28 via probe assembly 26, the transistor pair 70 and 74 associated with each output pad 84 can be tested.

If such test fails, the portion of substrate 10 failing the test is identified or designated accordingly, and, preferably, receives no further processing. However, if such test passes, the portion of substrate 10 can be subjected to further processing as shown in FIG. 1.

In the case where each output pad receives depositions to form an OLED, the portion of substrate 10 is advanced from test vacuum vessel 22 into deposition vacuum vessel 4-7. Deposition source 8-7 is charged with a hole transport material such as NPB ($C_{44}H_{32}N_2$) which is deposited through shadowmask 12-7 to form a hole transport layer 90 on each output pad 84 as shown in FIG. 3.

After deposition of hole transport layer 90, the portion of substrate 10 is advanced into deposition vacuum vessel 4-8. Deposition source 8-8 comprises two separately controllable deposition sources for depositing an emitter layer 92 comprised of an emitter material deposited by one deposition source and a dopant deposited by the other deposition source. In the case where deposition source 8-8 is utilized to form a red light emitting diode, the emitter material can be 98%–99.5% by weight of DCM ($C_{23}H_{21}N_3O$) and 2%–0.5% by weight of DMQA ($C_{22}H_{16}N_2O_3$). During deposition, deposition source 8-8 is controlled to deposit the emitter material and the dopant in the foregoing percentages to form emitter layer 92 on the hole transport layer 90 of every third output pad 84.

After emitter layer 92 is deposited to a sufficient extent, deposition source 8-8 is controlled to terminate the deposition of dopant material while continuing the deposition of emitter material. This continued deposition of emitter material absent dopant forms an electron transport layer 94 on the just deposited emitter layer 92 as shown in FIG. 3.

When the deposition of materials in deposition vacuum vessel 4-8 is complete, the portion of the substrate is sequentially stepped through deposition vacuum vessels 4-9 and 4-10 where deposition sources 8-9 and 8-10, respectively, deposit green and blue emitter layers 92 and electron transport layers 94 in the manner discussed above to form a plurality of a color triads on the portion of substrate 10. Each color triad includes separately controllable red, green and blue OLEDs.

To form green OLEDs, deposition source 8-9 co-deposits emitter material, such as $Alq_3$ ($C_{27}H_{18}AlN_3O_3$), and dopant, such as Coumarin 153 ($C_{16}H_{14}F_3O_2$), to form the emitter layers 92 of the green light emitting diodes and deposits only the emitter material to form the electron transport layer 94 of the green light emitting diodes. To form the blue OLEDs, deposition source 8-10 co-deposits an emitter material, such as PPD ($C_{52}H_{36}N_2$), and dopant, such as perylene ($C_{20}H_{12}$), to form the emitter layer 92 of the blue light emitting diodes and deposits only the emitter material to form the electron transport layer 94 of the blue light emitting diodes.

After each layer 90, 92 and 94 has been deposited on the output pads 84 to form the color triads discussed above, the portion of substrate 10 is advanced into deposition vacuum vessel 4-11. Deposition source 8-11 is charged with a conductive material 96 which is deposited through shadowmask 12-11 onto the layer of electron transport material 94 of each OLED. More preferably, providing conductive material 96 does not contact any of the conducting material 80 forming each output pad 84, conducting material 96 is deposited as a contiguous layer over all of the OLEDs formed on the portion of substrate 10. In this manner, it is only necessary to contact this contiguous layer of conducting material at a few points in order to form a cathode 98 for all of the OLEDs formed on the portion of substrate 10. In this configuration, the layer of conductive material 96 acts as a common cathode structure for all of the OLEDs formed on the portion of substrate 10 while the output pad 84 associated with each OLED operates as an anode structure for the OLED structure associated therewith. If conductive material 96 is only deposited over the OLED structure associated with each output pad 84, it will be necessary to connect each deposit of conducting material 96 to an appropriate cathode bias source.

After conducting material 96 has been deposited, the portion of substrate 10 is advanced from deposition vacuum vessel 4-11 to deposition vacuum vessel 4-12. Deposition source 8-12 is charged with a sealing material 98 which is deposited through a shadowmask 12-12 onto substantially all of the exposed surface of the materials deposited on the portion of substrate 10. To enable electrical contact to be made with buses 64, 68, 72 and the one or more deposits of conducting material 96, sealing material 98 is not deposited on the input ends of buses 64, 68, 72 nor is sealing material 98 deposited on all or part of the one or more deposits of conducting material 96 Sealing material 98 is configured to avoid moisture and particulate matter from contacting any of the deposited materials other than those portions of the deposited materials that have been intentionally left exposed.

Alternatively, deposition vacuum vessel 4-12 can be considered to be representative of a plurality of series connected deposition vacuum vessels disposed between deposition vacuum vessel 4-11 and storage vacuum vessel 39. Each of these series connected deposition vacuum vessels can include a deposition source 8 charged with a suitable material which is deposited through a shadowmask 12 on one or more portions of substrate 10 as it is advanced therethrough to form a protective seal thereover. A system which can be adapted for use in the embodiment of production system 2 shown in FIG. 1 is the Guardian™ tool, designed by Vitec Systems, Inc. of San Jose, Calif. This system includes series connected deposition vacuum vessels for depositing a liquid monomer on substantially all of the exposed surfaces of materials deposited on the portion of substrate 10 to create a microscopically flat surface. The liquid monomer is then hardened (polymerized) into a solid polymer film. A first layer of transparent ceramic is then deposited to create a first barrier, and a second polymer layer is applied to protect the barrier and create a second flat surface. This barrier/polymer combination is repeated as necessary until a desired level of impermeability is achieved.

In the foregoing description, it has been assumed that substrate 10 is a continuous sheet. After sealing material 98 is deposited, the portion of substrate 10 in deposition vacuum vessel 4-12 is advanced therefrom whereupon cutter 36 cuts the portion of substrate 10 from the remainder of substrate 10. Thereafter, the cut portion of substrate 10 is stored in storage means 38 of storage vacuum vessel 39 for subsequent processing or use. Alternatively, cutter 36 can be replaced with a take-up reel (not shown) which receives substrate 10 as it is advanced from deposition vacuum vessel 4-12.

The deposition of materials through shadowmasks 12 described above is for the purpose of illustrating the invention and is in no way to be construed as limiting the invention. As would be apparent to one of ordinary skill in the art, more than one shadowmask 12 may be required in a single deposition vacuum vessel 4 in order to form the pattern described. For example, in order to deposit insulating material 76 in the manner shown in FIG. 8, two or more shadowmasks 12 may be employed, either simultaneously or one at a time, to deposit the pattern of insulating material 76 shown. To this end, deposition vacuum vessel 4-5 may include means (not shown) for exchanging the various shadowmasks needed to deposit the pattern of insulating material 76 shown. Alternatively, deposition vacuum vessel 4-5 can be considered to be representative of a plurality of series connected deposition vacuum vessels disposed between deposition vacuum vessels 4-4 and 4-6. Each of these series connected deposition vacuum vessels can include a deposition source 8 charged with insulating material 76 which is deposited through a shadowmask 12 on a select portion of substrate 10 as it is advanced therethrough. Collectively, the deposition of insulating material 76 by these series connected deposition vacuum vessels would produce the pattern of insulating material 76 shown in FIG. 8. Similarly, the deposition of conducting material 66 to form conducting material portions 66-1–66-4 may require a plurality of shadowmasks 12, each having a different pattern of apertures 14 therein, interchangeably positionable in deposition vacuum vessel 4-4. Alternatively, deposition vacuum vessel 4-4 can be considered to be representative of a plurality of series connected deposition vacuum vessels disposed between deposition vacuum vessels 4-3 and 4-5. Each of these series connected deposition vacuum vessels can include a deposition source 8 charged with conducting material 66 which is deposited through one of the shadowmasks on a select portion of substrate 10 as it is advanced therethrough. Collectively, the deposition of conducting material 66 by these series connected deposition vacuum vessels would produce the pattern of conducting material 66 shown in FIG. 7. Similar comments apply in respect of any other shadowmask 12 where the volume of apertures 14 therein adversely affects the structural rigidity of the sheet 16 forming the shadowmask 12.

As can be seen from the foregoing, the present invention enables formation of one or more electronic elements on a substrate by successive deposition of materials on the substrate. Importantly, each electronic element is formed without the need for subtractive processing, i.e., the removal of material. This represents an important improvement over the prior art in that the formation of these electronic elements can occur by a continuous sequence of depositions whereby the throughput rate of producing substrates having such electronic elements formed thereon is substantially improved. In addition, the present invention enables certain controlled elements, such as OLEDs, to be deposited on the electronic elements in order to form complete systems, such as an array of color triads for a display.

Electronic elements formed on substrate 10 in the foregoing manner can be utilized for numerous applications other than OLEDs for forming pixels of a display. For example, the electronic elements deposited on the substrate can be used for large area arrays for acoustic or x-ray imaging, arrays for optical image processing, high voltage arrays for plasma display panels and large area adaptive and learning networks. In addition, substrate 10 is not limited to having an electrical insulating layer 52 overlaying an electrically conductive layer 50. To this end, substrate 10 can be formed from paper, plastic or any other material upon which suitable materials can be deposited.

The invention has been described with reference to one preferred embodiment. Obvious modifications and alterations will occur to others upon reading and understanding the preceding detailed description. For example, the described sequence can be modified as necessary to suit a particular application. To this end, controlled elements can be deposited first followed by the deposit of the electronic elements. Accordingly, the invention is not in any way to be construed as being limited by the foregoing description, but, rather, it is intended that the invention be construed as including all such modifications and alterations insofar as they come within the scope of the appended claims or the equivalents thereof.

The invention claimed is:

1. A method of forming an electronic device comprising the steps of:

(a) advancing a substrate through a plurality of series connected deposition vacuum vessels, with each deposition vacuum vessel having at least one material deposition source and a shadowmask positioned therein; and (b) depositing on the substrate in the presence of a vacuum in each deposition vacuum vessel the material from the at least one material deposition source positioned in the deposition vacuum vessel through the shadowmask positioned therein to form on the substrate a circuit comprised of an array of electronic elements, wherein the physical layout of the circuit is formed solely by the successive deposition of materials on the substrate.

2. The method as set forth in claim 1, wherein the substrate is at least one of (i) electrically conductive, (ii) flexible and (iii) transparent.

3. The method as set forth in claim 2, wherein, when the substrate is electrically conductive, an electrical insulator separates the circuit from the substrate.

4. The method as set forth in claim 1, wherein:

the substrate is an elongated sheet that is advanced along its length through the plurality of deposition vacuum vessels whereupon at least one part of the substrate advances sequentially through each deposition vacuum vessel; and the one part of the substrate receives deposits of materials from the deposition sources positioned in the deposition vacuum vessels.

5. The method as set forth in claim 4, wherein the substrate defines along its length a plurality of spaced parts which are advanced through the plurality of vacuum vessels whereupon each part receives a deposit of material from the deposition source positioned in each vacuum vessel.

6. The method as set forth in claim 1, wherein:

the electronic elements are thin film transistors (TFT); and step (b) includes the steps of:

depositing a semiconducting material of each TFT;

depositing a first conductive material in a manner to form with the semiconducting material of each TFT a source and a drain therefor;

depositing a first, gate insulator on at least part of each of the semiconducting material, the source and the drain of each TFT;

depositing a second conductive material on at least part of the gate insulator of each TFT in a manner to form a gate therefor; and depositing a second insulator over the second conductive material of each TFT in a manner whereupon at least a part of the first conductive material is exposed through the second insulator.

7. The method as set forth in claim 6, wherein step (b) further includes depositing a third conductive material to form an output pad for at least one TFT, wherein the output pad covers the second insulator and the exposed part of the first conductive material so that the third conductive material is in electrical communication with the exposed part of the first conductive material.

8. The method as set forth in claim 6, wherein:

the first conductive material is deposited in a manner to form with one of the source and the drain of at least one TFT a first address bus;

the second conductive material is deposited in a manner to form with the other of the source and the drain of the at least one TFT a second address bus; and each address bus is individually addressable.

9. The method as set forth in claim 6, wherein:

TFTs in each column or row of TFTs are connected to a common address bus of the circuit; and each address bus is individually addressable.

10. The method as set forth in claim 6, wherein the semiconducting material is cadmium selenide (CdSe).

11. The method as set forth in claim 6, wherein the first insulator, the second conductive material and the second insulator are deposited in a manner that leaves at least part of the first conductive material forming one of the source and the drain of each TFT exposed.

12. The method as set forth in claim 1, wherein:

the electronic elements are thin film transistors (TFTs); and the circuit formed in step (b) includes a plurality of deposited light emitting elements, with the TFTs disposed between the substrate and the light emitting elements.

13. The method as set forth in claim 12, wherein step (b) includes the steps of:

depositing a hole transport material of each light emitting element on the substrate in electrical communication with a power terminal of the TFT associated with the light emitting element;

depositing a light emitting material of each light emitting element over at least part of the hole transport material in alignment with or adjacent to the power terminal associated with the TFT for the light emitting element;

depositing an electron transport material of each light emitting element over at least part of the light emitting material of each light emitting element; and depositing a conductive material of each light emitting element over at least part of the electron transport material thereof.

14. The method as set forth in claim 13, wherein the conductive material is deposited substantially over the entire circuit.

15. The method as set forth in claim 13, wherein the plurality of light emitting elements is comprised of plural red, plural green and plural blue light emitting elements.

16. The method as set forth in claim 1, wherein:

the electronic elements are thin filmed transistors (TFT); and step (b) includes the steps of:

depositing a layer of semiconductor material on the substrate;

depositing a first layer of semiconductor compatible conductive material relative to the semiconductor material and the substrate in a manner to form therewith a source and drain of each thin film transistor;

depositing a first insulator layer relative to the semiconductor material, the source and the drain in a manner to form therewith a gate insulator; and depositing a second layer of conductive material relative to the gate insulator, the semiconductor material, the source and the drain in a manner to form therewith a gate of the thin film transistor.

17. The method as set forth in claim 16, wherein step (b) further includes the steps of:

depositing a second insulator layer relative to the second layer of conductive material and the first insulator layer in a manner whereupon at least part of the first layer of conductive material is exposed through a window in the second insulator layer; and depositing a third layer of conductive material through the window in the second insulator layer to form an output pad.

18. The method as set forth in claim 1, further including the steps of:

testing the array of electronic elements in the presence of a vacuum; and as a function of such test passing or failing, designating the substrate accordingly.

* * * * *